US006566240B2

(12) United States Patent
Udrea et al.

(10) Patent No.: US 6,566,240 B2
(45) Date of Patent: May 20, 2003

(54) SEMICONDUCTOR DEVICE AND METHOD OF FORMING A SEMICONDUCTOR DEVICE

(75) Inventors: Florin Udrea, Cambridge (GB); Gehan A. J. Amaratunga, Cambridge (GB)

(73) Assignee: Cambridge Semiconductor Limited, Cambridge (GB)

( * ) Notice: Subject to any disclaimer, the term of this patent is extended or adjusted under 35 U.S.C. 154(b) by 0 days.

(21) Appl. No.: 09/957,609

(22) Filed: Sep. 21, 2001

(65) Prior Publication Data

US 2002/0034843 A1 Mar. 21, 2002

Related U.S. Application Data

(60) Provisional application No. 60/234,292, filed on Sep. 21, 2000.

(51) Int. Cl.[7] .............................................. H01L 21/44
(52) U.S. Cl. ........................ 438/612; 438/110; 438/112
(58) Field of Search ......................... 257/52, 622, 625; 438/424, 692, 693, 952, 612, 110, 112, 113, 458, 459, 460, 462, 613, 617

(56) References Cited

U.S. PATENT DOCUMENTS

| 3,689,992 A | | 9/1972 | Schutze et al. | |
|---|---|---|---|---|
| 4,571,611 A | | 2/1986 | Kashiwagi | |
| 4,870,475 A | * | 9/1989 | Endo et al. .................. | 257/508 |
| 4,929,986 A | * | 5/1990 | Yoder .......................... | 257/275 |
| 5,109,268 A | | 4/1992 | Butera | |
| 5,272,104 A | * | 12/1993 | Schrantz et al. ..... | 148/DIG. 12 |
| 5,276,338 A | * | 1/1994 | Beyer et al. ................. | 257/501 |
| 5,313,094 A | * | 5/1994 | Beyer et al. ................. | 257/622 |
| 5,354,717 A | | 10/1994 | Pollock et al. | |
| 5,403,729 A | * | 4/1995 | Richards et al. ... | 148/DIG. 135 |
| 5,444,009 A | * | 8/1995 | Richards et al. ... | 148/DIG. 135 |
| 5,521,420 A | * | 5/1996 | Richards et al. ............. | 257/693 |
| 5,650,639 A | * | 7/1997 | Schrantz et al. ............. | 257/347 |
| 5,656,547 A | * | 8/1997 | Richards et al. ............. | 438/460 |
| 5,895,972 A | | 4/1999 | Paniccia | |
| 6,221,751 B1 | * | 4/2001 | Chen et al. .................. | 438/110 |
| 6,316,329 B1 | * | 11/2001 | Hirota et al. ................ | 438/424 |

FOREIGN PATENT DOCUMENTS

| EP | 0 317 124 | 5/1989 |
|---|---|---|
| EP | 0 552 475 | 7/1993 |
| EP | 0 814 509 A2 | 12/1997 |
| WO | 94/15359 | 7/1994 |

* cited by examiner

*Primary Examiner*—Carl Whitehead, Jr.
*Assistant Examiner*—Laura M Schillinger
(74) *Attorney, Agent, or Firm*—Pillsbury Winthrop LLP

(57) ABSTRACT

A semiconductor device having an active region is formed in a layer provided on a semiconductor substrate. At least a portion of the semiconductor substrate below at least a portion of the active region is removed such that the portion of the active region is provided in a membrane defined by that portion of the layer below which the semiconductor substrate has been removed. A heat conducting and electrically insulating layer is applied to the bottom surface of the membrane. The heat conducting and electrically insulating layer has a thermal conductivity that is higher than the thermal conductivity of the membrane so that the heat conducting and electrically insulating layer allows heat to pass from the active region into the heat conducting and electrically insulating layer during normal operation of the device.

10 Claims, 5 Drawing Sheets

SEMICONDUCTOR DEVICE AND METHOD OF FORMING A SEMICONDUCTOR DEVICE

The present application claims priority to U.S. Provisional Application of Udrea et al., Ser. No. 60/234,292 filed on Sep. 21, 2000, the entirety of which is hereby incorporated into the present application by reference.

BACKGROUND OF THE INVENTION

1. Field of the Invention

The present invention relates to a semiconductor device and to a method of forming a semiconductor device.

The present invention is concerned with a broad class of semiconductor devices, and particularly integrated circuits, including microprocessors, analogue and digital CMOS, BiCMOS and smart-power circuits. The present invention has particular applicability to devices that use silicon-on-insulator (SOI) technologies though it is applicable to other technologies such as the bulk planar technologies.

2. Description of Related Art

A known problem of conventional integrated circuits is that they can suffer from self-heating due to excessive power developed within the active region of the circuit which is converted to heat. Heat in such circuits may be developed during on-state or transient operation and can be caused by DC, AC or RF electrical power. This heat can cause high temperature effects such as latch-up, parasitic bipolar conduction, reduction of channel mobility, and threshold voltage variation in MOS devices, and generally can cause reliability problems. Local heating or hot spots are particularly damaging to circuit performance and reliability.

In order to dissipate the heat and therefore to prevent high temperatures from being developed in the integrated circuits, various techniques are known. Examples are disclosed in U.S. Pat. Nos. 5,895,972, 5,650,639, 5,354,717, 5,109,268, EP-A-0552475, EP-A-0317124 and WO-A-94/15359. In most of these prior art disclosures, a silicon substrate is deposited as a layer on or bonded as a wafer to a diamond substrate and then appropriate processing steps (including doping, etc.) are carried out on the silicon in order to form the semiconductor devices.

In U.S. Pat. No. 5,895,972 there is disclosed a method and apparatus for cooling a semiconductor device during the testing and debugging phases during development of a device. In place of conventional heat slugs such as copper, a heat slug of material that is transparent to infra red is fixed to the device. A diamond heat slug is disclosed as preferred. It is disclosed that the substrate on which the device is formed can be thinned prior to applying the infra red transparent heat slug to the device. The purpose of this thinning of the substrate is solely to reduce transmission losses that occur during optical testing and debugging of the device using infra red beams. This process is carried out during development of the device. The heat slug is not used during normal operation of the device. Indeed, the device that has been tested in this way will normally be destroyed by this process as this testing is carried out to obtain data on the class of devices as a whole and is not for example part of the normal testing of a device intended for retail.

U.S. Pat. No. 3,689,992 discloses a technique for isolating various regions of a semiconductor device from each other. In one of the examples described, various insulator layers are laid over the back of the device and then a support layer, specifically exemplified by polycrystalline semiconductor material, is laid over the back of these insulator layers.

SUMMARY OF THE INVENTION

According to a first aspect of the present invention, there is provided a method of forming a semiconductor device having an active region, the method comprising the steps of: forming, in a layer provided on a semiconductor substrate, a semiconductor device having an active region; removing at least a portion of the semiconductor substrate below at least a portion of the active region such that said at least a portion of the active region is provided in a membrane defined by that portion of the layer below which the semiconductor substrate has been removed; and, applying a heat conducting and electrically insulating layer to the bottom surface of the membrane, the heat conducting and electrically insulating layer having a thermal conductivity that is higher than the thermal conductivity of the membrane so that the heat conducting and electrically insulating layer allows heat to pass from the active region into the heat conducting and electrically insulating layer during normal operation of the device.

Said at least portion of the semiconductor substrate may be removed by wet etching.

Said at least a portion of the semiconductor substrate may be removed by dry etching.

The heat conducting and electrically insulating layer most preferably comprises diamond. The diamond will typically be deposited as a layer of polycrystalline or amorphous diamond.

Alternatively or additionally, the heat conducting and electrically insulating layer may comprise at least one of boron nitride, aluminium oxide, and aluminium nitride.

The heat conducting and electrically insulating layer may be applied by blanket deposition.

The semiconductor device may be provided on an electrically insulating layer, the electrically insulating layer being provided on the substrate, and the step of removing at least a portion of the semiconductor substrate below at least a portion of the active region may comprise removing said at least a portion of the semiconductor substrate up to the electrically insulating layer. Such an embodiment may be a device of the silicon-on-insulator (SOI) type.

The method may comprise the step of removing plural discrete portions of the semiconductor substrate to provide plural membranes, each membrane having provided therein a respective active region of one or more semiconductor devices; and in the applying step, a heat conducting and electrically insulating layer may be applied to the bottom surface of each membrane.

The semiconductor device may be an integrated circuit.

According to a second aspect of the present invention, there is provided a semiconductor device manufactured in accordance with the method or any of its preferred embodiments described above.

According to a third aspect of the present invention, there is provided a semiconductor device having an active region that generates heat during normal operation of the device, at least a portion of the active region being provided in a membrane having opposed top and bottom surfaces, the bottom surface of the membrane having a heat conducting and electrically insulating layer positioned adjacent thereto, the heat conducting and electrically insulating layer having a thermal conductivity that is higher than the thermal conductivity of the membrane so that the heat conducting and electrically insulating layer allows heat to pass from the active region into the heat conducting and electrically insulating layer during normal operation of the device.

According to a fourth aspect of the present invention, there is provided a semiconductor device having an active region provided in a layer, the active region generating heat during normal operation of the device, the layer being provided on a semiconductor substrate, at least a portion of the semiconductor substrate below at least a portion of the active region being removed such that said at least a portion of the active region is provided in a membrane defined by that portion of the layer below which the semiconductor substrate has been removed, the bottom surface of the membrane having a heat conducting and electrically insulating layer positioned adjacent thereto, the heat conducting and electrically insulating layer having a thermal conductivity that is higher than the thermal conductivity of the membrane so that the heat conducting and electrically insulating layer allows heat to pass from the active region into the heat conducting and electrically insulating layer during normal operation of the device.

The device may comprise at least two semiconductor substrate legs between which the membrane is provided. In a typical embodiment, the substrate legs will be formed by removal of a portion of the substrate on which the device is initially formed. Such legs continue to provide mechanical support for the device.

The whole of the active region may be provided in the membrane.

The membrane may comprise a semiconductor layer provided on an electrically insulating layer.

The heat conducting and electrically insulating layer most preferably comprises diamond.

The heat conducting and electrically insulating layer may alternatively or additionally comprise at least one of boron nitride, aluminium oxide and aluminium nitride.

The heat conducting and electrically insulating layer is preferably deposited at lower temperatures compared to the temperatures used in processing the active structure of the device.

The membrane may include a mechanically strong and electrically insulating layer between said at least a portion of the active region and the heat conducting and electrically insulating layer.

The preferred embodiments of the present invention have several advantages over the prior art. The membrane and the heat conducting and electrically insulating layer are formed after the main technological steps involved in the fabrication of the circuit or device have been completed. Thus, mechanical support is provided by the original semiconductor substrate during the technological process. This means that this method is fully compatible with existing technologies such as CMOS, bipolar or bi-CMOS and can be carried out as a post-process fabrication step. Moreover, the heat conducting and electrically insulating layer can be applied to the back of the membrane by a blanket deposition after the membrane is formed and preferably at low temperatures such that the diffusion and the general geometrical and doping profile of the layers above are substantially unaffected. The membrane and heat conducting and electrically insulating layer may be provided under the entire circuit or under portions of the integrated circuit where hot spots occur to cool selectively parts of the integrated circuit. Unlike in prior art devices or circuits, the heat conducting and electrically insulating layer can be situated below the active structure in very close proximity, of the order of microns or sub-microns, to the active structure and makes a good and effective thermal contact to the top devices and circuits. The heat conducting and electrically insulating layer may be applied from the back side over an existing insulating layer such as are characteristic of silicon-on-insulator (SOI) structures and thus would not affect the back interface of the semiconductor layer. This is in contrast with the prior art case where a diamond substrate is bonded to silicon prior to fabrication of devices in the top silicon layer; this may result in the formation of a poor quality layer of silicon carbide layer at the silicon/diamond interface which in turn will affect the electrical performance of the devices and circuits. Finally, the heat conducting and electrically insulating layer can be provided from the back side over the whole area of the device or wafer. This layer may not need masking and photolithography and can be provided by blanket deposition. Therefore, the heat conducting and electrically insulating layer does not have to be etched selectively against the substrate or any other layers present in the device. This makes the fabrication process fully compatible with current integrated circuit technologies and significantly simpler than prior-art methods. Finally, the heat conducting and electrically insulating layer may be in contact with an external heat sink to further dissipate the heat.

BRIEF DESCRIPTION OF THE DRAWINGS

Embodiments of the present invention will now be described by way of example with reference to the accompanying drawings, in which.

DETAILED DESCRIPTION

Figure 1A:
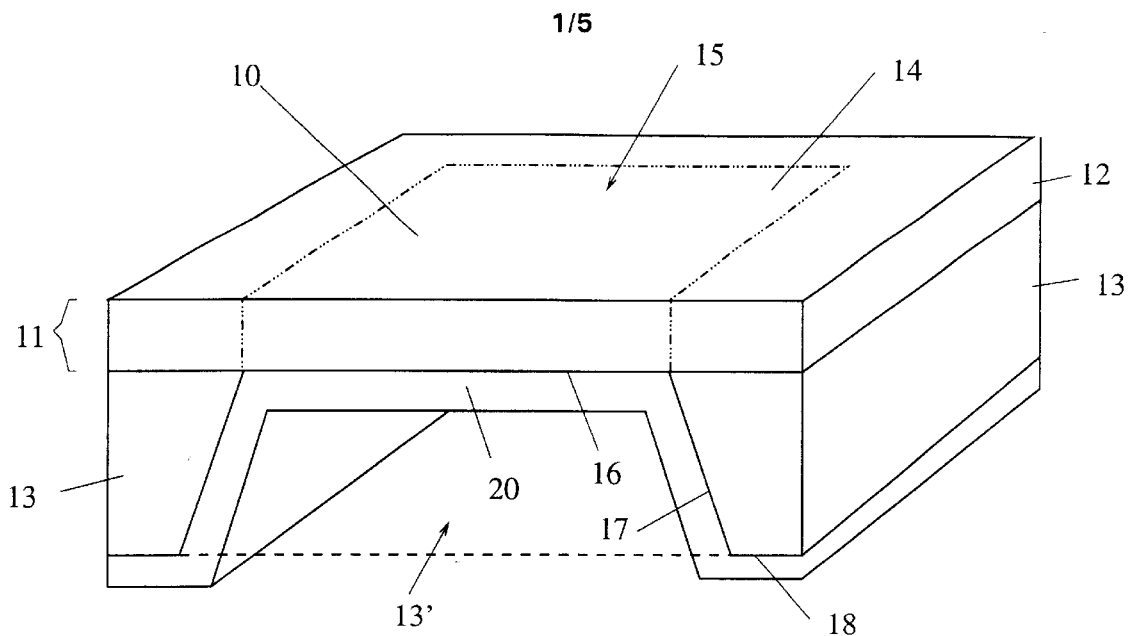
FIGS. 1a, 1b, 2a, 2b, 3a and 3b are each perspective views of examples of devices according to the present invention.

Referring now to FIG. 1a, a first example of a device according to the present invention includes an integrated circuit 10 provided in a thin layer 11 which comprises at least one semiconductor layer 12. The thin layer 11 is provided on a semiconductor substrate 13. The original full extent of the substrate 13 is indicted by a dashed line in FIG. 1a. In an example of a method of manufacturing the device in accordance with the present invention, an integrated circuit 10 is formed in the semiconductor layer 12 by known processing steps (including doping, deposition of additional layers, etching, oxidation, etc.). The integrated circuit may be of many different types, including for example microprocessors, analogue and digital CMOS, BiCMOS and smart-power circuits. After the whole or substantially the whole of the integrated circuit 10 has been formed in the semiconductor layer 12, a portion 13' of the substrate 13 is removed from underneath at least a portion of the active region of the integrated circuit 10. This portion 13' is entirely removed up to the thin layer 11 in order to leave a region of the thin layer 11 below which there is no substrate 13, this region being referred to herein as a membrane 14 (shown within the dot and dashed lines in the figures). The remaining portions of the substrate 13 form support legs.

The membrane 14 has a top surface 15, to which electrical connections can be made, and a bottom surface 16. The whole of the substrate 13 below the active region of the integrated circuit 10 may be removed such that the whole of at least the active region of the integrated circuit 10 is provided in the membrane 14. The whole of the integrated circuit 10 may be provided in the membrane 14. The portions of the substrate 13 that remain under the thin layer 11 have side walls 17 and bottom walls 18.

A heat conducting and electrically insulating layer 20 is formed over at least the bottom surface 16 of the membrane 14. In the examples shown in FIG. 1a and the other Figures described in more detail below, the heat conducting and electrically insulating layer 20 extends down the side walls 17 and under the bottom walls 18 of the remaining parts of the substrate 13, though this may not be necessary in some embodiments.

The heat conducting and electrically insulating layer 20 has a higher thermal conductivity than the thin layer 11. In a preferred embodiment, the heat conducting and electrically insulating layer 20 is polycrystalline diamond (which is a good electrical insulator but which has high thermal conductivity) and/or one or more of boron nitride, aluminium oxide and aluminium nitride. The electrical resistivity of the heat conducting and electrically insulating layer 20 is preferably several orders of magnitude higher than the electrical resistivity of the semiconductor layer 12, which is typically in the range of about $10^{-3}$ to 1 $\Omega$m. Preferably, the electrical resistivity of the heat conducting and electrically insulating layer 20 is higher than about $10^{10}$ $\Omega$m.

The heat conducting and electrically insulating layer 20 is preferably deposited by blanket deposition. This does not require masking or selective etching against other materials. The deposition may be carried out at low temperatures. The heat conducting and electrically insulating layer 20 serves to remove efficiently a large portion of the heat which would otherwise be trapped within the integrated circuit 10 during normal operation. In this and the other examples described in more detail below, an external heat sink (not shown) is preferably in thermal contact with the heat conducting and electrically insulating layer 20 to extract heat most efficiently from the integrated circuit 10.

Figure 1B:
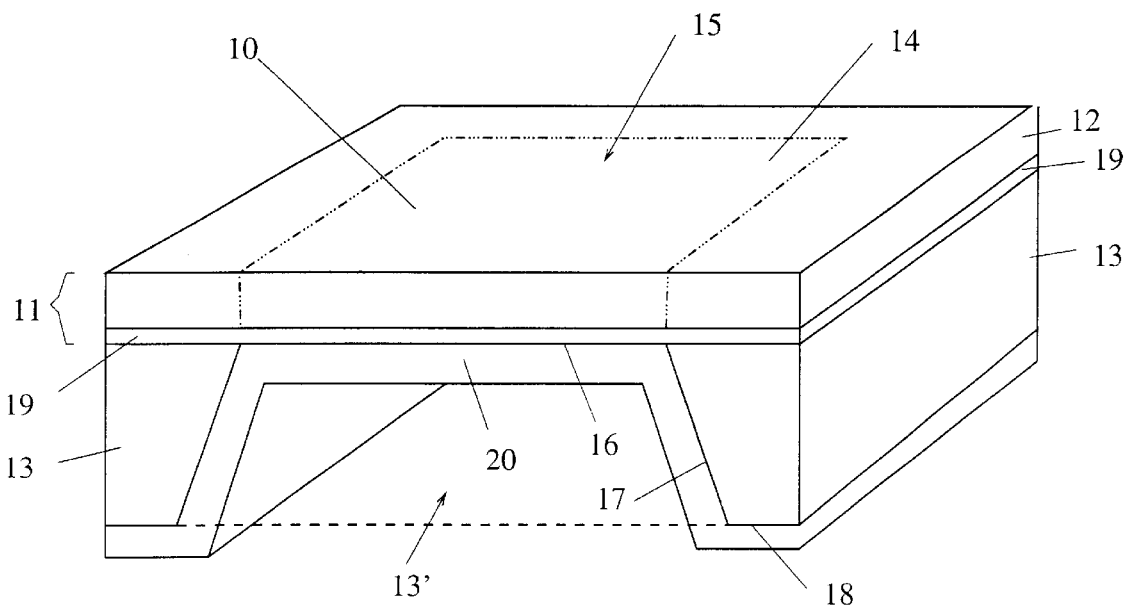

The example shown in FIG. 1b is a variant of the example shown in FIG. 1a. In the example of FIG. 1b, the thin layer 11 includes a semiconductor layer 12 formed on an electrically insulating layer 19 which itself is formed on a semiconductor substrate 13. As in the example of FIG. 1a, the integrated circuit 10 is preferably first formed in the semiconductor layer 12. After the whole or substantially the whole of the integrated circuit 10 has been formed, the substrate 13 is partially removed under at least a portion of the active region of the integrated circuit 10 and preferably the whole of the active region of the integrated circuit 10 and entirely up to the oxide layer 19 in order to provide the thin membrane 14 under which there is no semiconductor substrate. The heat conducting and electrically insulating layer 20 is then formed over the bottom surface 16 of the membrane 14 which, in this example, is provided by the bottom surface of the insulating layer 19 which is exposed by removal of the substrate 13. As in the example shown in FIG. 1a, the heat conducting and electrically insulating layer 20 of this example extends down the side walls 17 and under the bottom walls 18 of the remaining leg portions of the substrate 13. The material of the heat conducting and electrically insulating layer 20 may be any of the examples mentioned above with reference to FIG. 1a. The semiconductor layer 12 may be made of silicon or other known semiconductors used in electronics including, for example, SiC, GaAs, GaN and diamond. The insulating layer 19 may be made of silicon oxide, nitride or glass for example. The original substrate 13 may be of the same material as the semiconductor layer 12 and may for example be made of silicon or other semiconductors. Where the semiconductor layer 12 is made of silicon and the substrate 13 is also made of silicon, the original structure may be of silicon-on-insulator (SOI) type.

Figure 2A:
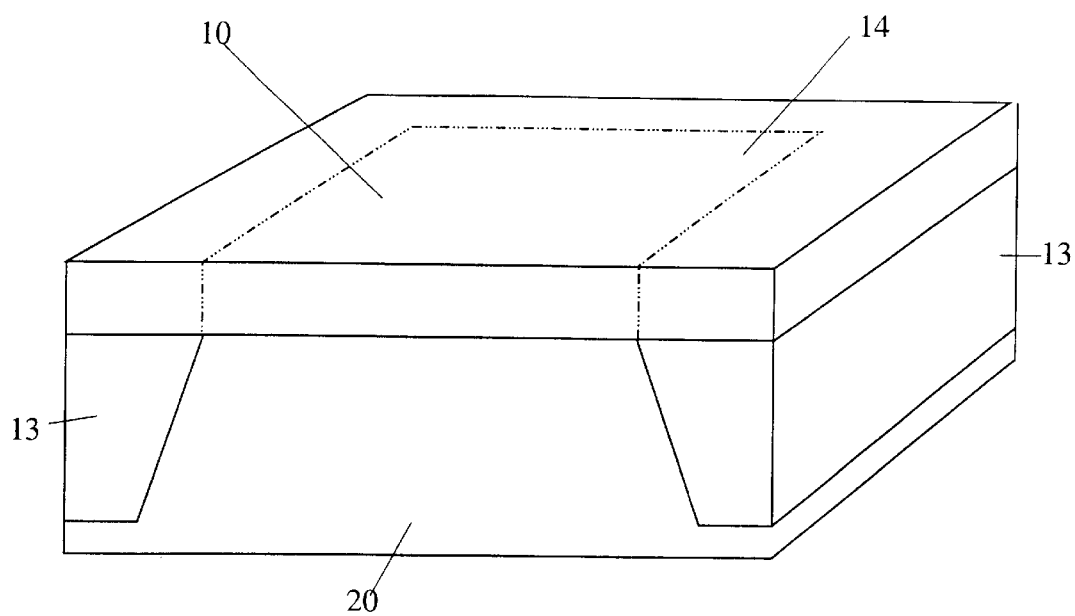
Figure 2B:
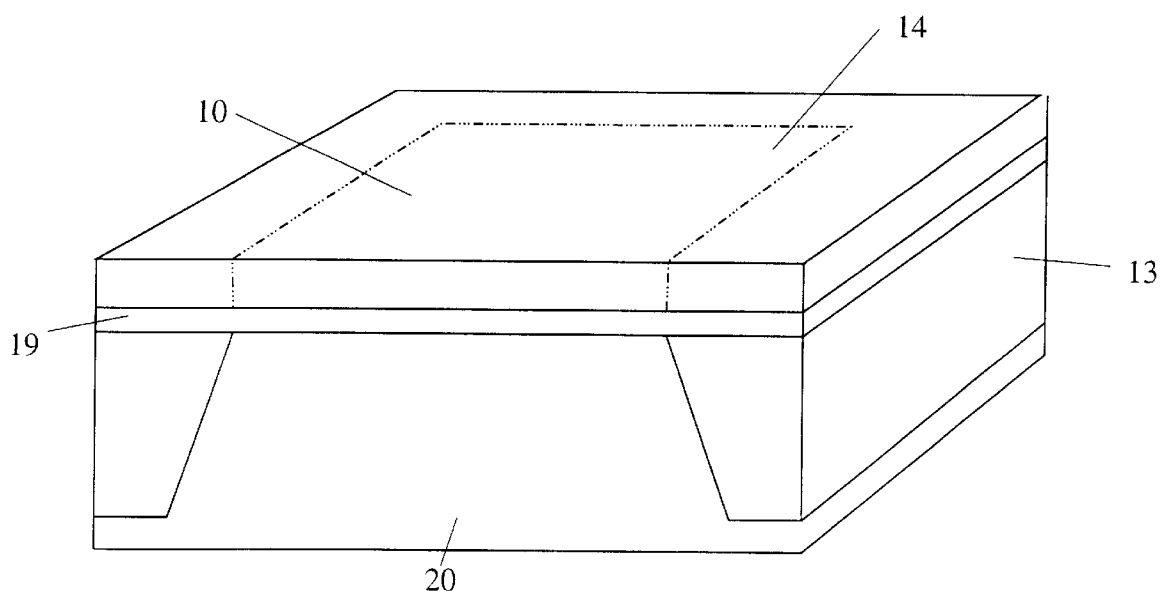

The examples shown in FIGS. 2a and 2b correspond respectively to the examples shown in FIGS. 1a and 1b but differ in that the heat conducting and electrically insulating layer 20 is not formed merely as a thin layer under the membrane 14. On the contrary, in the examples shown in FIGS. 2a and 2b, the heat conducting and electrically insulating layer 20 entirely fills the space left by the removed portion 13' of the substrate 13.

Figure 3A:
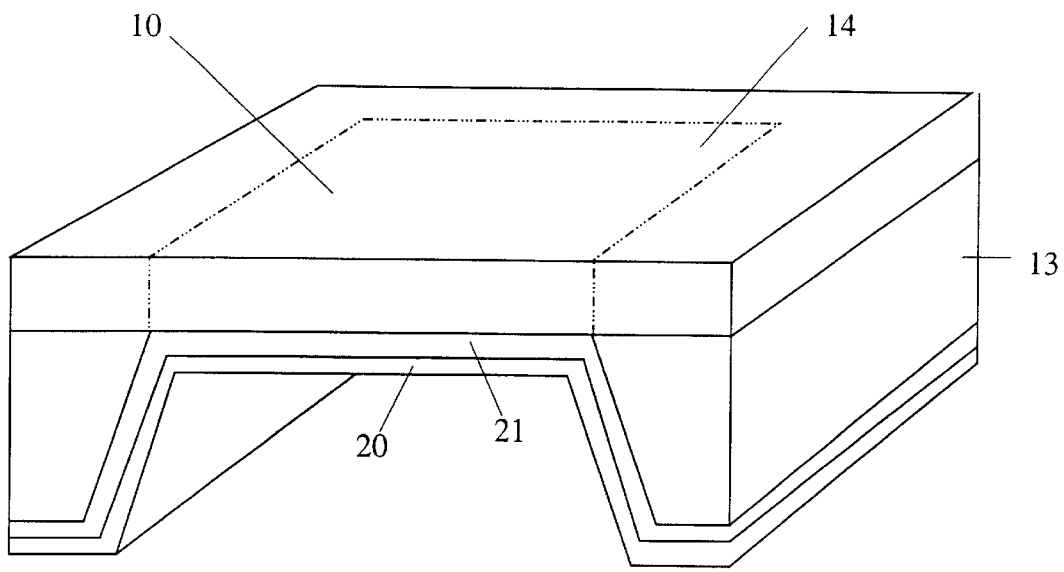
Figure 3B:
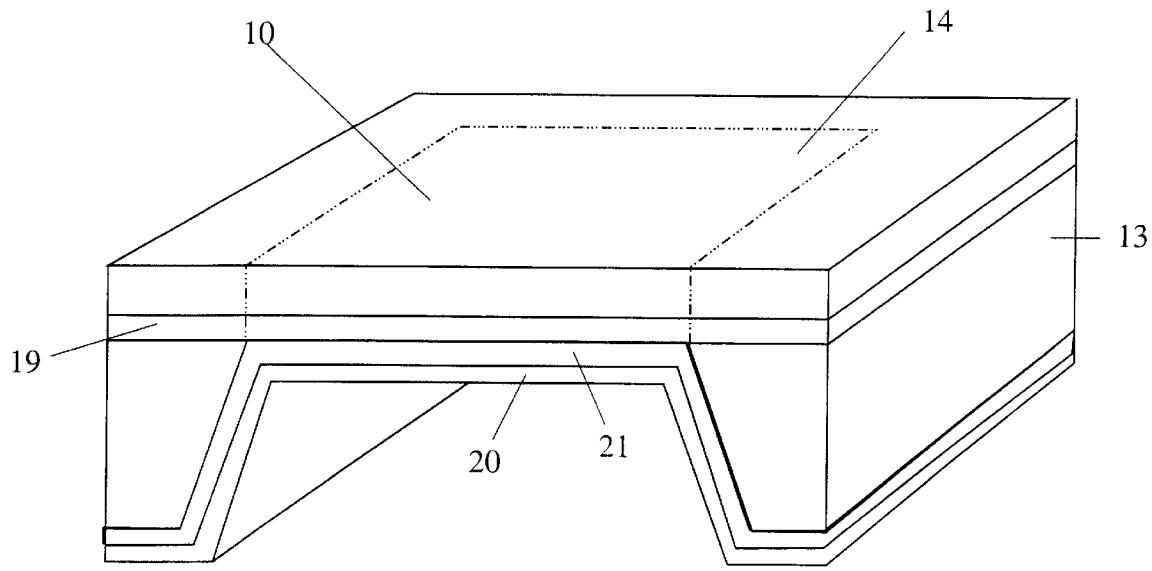

As indicated in FIGS. 3a and 3b, which correspond respectively to the examples of FIGS. 1a and 2a and FIGS. 1b and 2b, one or more electrically insulating layers 21 may be interposed between at least the membrane 14 and the heat conducting and electrically insulating layer 20 in order to improve the mechanical stability of the membrane 14 and its resistance to rupture and/or to compensate for mechanical stress in the membrane 14. In addition or alternatively, buffer layers may be provided between at least the membrane 14 and the heat conducting and electrically insulating layer 20 and any other layers in order to increase adhesion and/or to compensate for thermal mismatch between different layers. The insulating layers 21 and buffer layer may be for example nitrides, oxides, amorphous materials or polycrystalline materials.

Figure 4A:
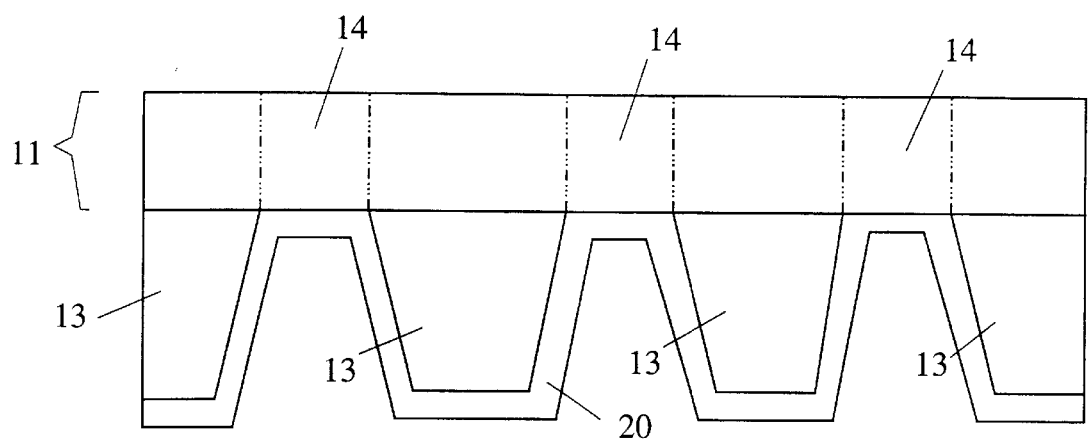
FIG. 4a and FIG. 4b are respectively a vertical cross-sectional view and a plan view from above of a further example of a device according to the present invention; and, FIGS. 5a and 5b are respectively a perspective view and a plan view from above of a further example of a device according to the present invention.
Figure 4B:
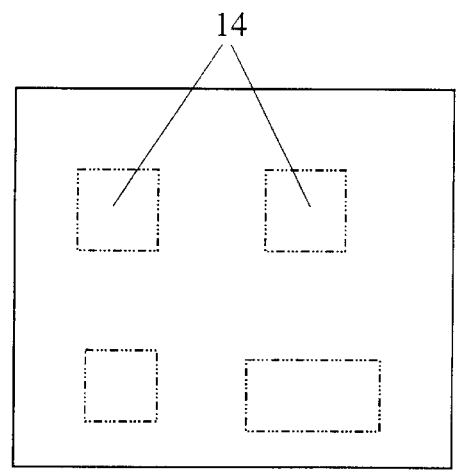

As indicated schematically in FIGS. 4a and 4b, several membranes 14 may be provided within the same thin layer 11 by removing plural discrete portions of the substrate 13 under the thin layer 11. Each of the plural membranes 14 may be formed such that each contains at least a portion of an active region of a respective integrated circuit. Alternatively or additionally, the plural membranes 14 may be formed such that two or more contain at least a portion of different active regions of the same integrated circuit. In that way, heat can be extracted more efficiently from the particularly hot portions found in the different active regions of an integrated circuit. In each case, as much substrate 13 as possible remains, thereby providing mechanical strength and resistance to rupture of the membranes 14. It will be appreciated that this can apply whether the integrated circuit or circuits are of the bulk silicon (i.e. non-SOI) or the SOI type, a mixture of these or of different semiconductor materials.

In all of the examples described above and shown in FIGS. 1 to 4, the side walls 17 of the substrate 13 are angled to the plane of the thin layer 11. This is because the most common technique for back side etching is wet anisotropic etching, which is typically performed using a KOH solution. The silicon substrate 13 is a mono-crystal and the etching rates of anisotropic etchants is dependent on the crystal orientation. The etch-stop planes are usually the (111) planes. Those devices of the SOI type that have a buried oxide layer 19 have the advantage that the back side etch stops automatically at the buried oxide 19 since the etch of the oxide is for many etchants (including KOH) much slower than that of silicon. Alternatively, for bulk silicon (i.e. non-SOI) devices, the back side etch can be controlled in time or electrochemically.

Figure 5A:
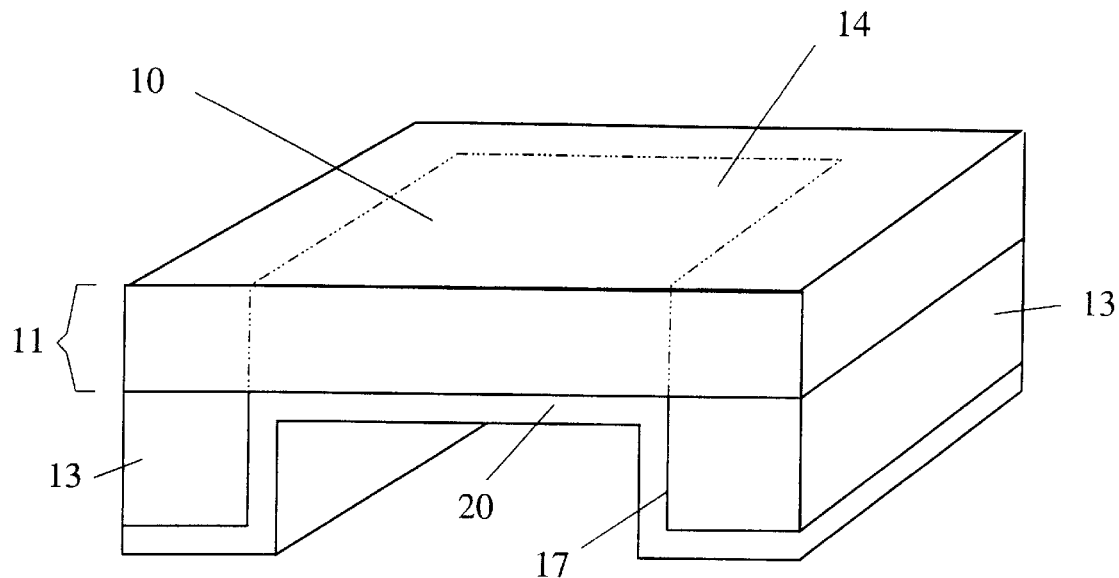
Figure 5B:
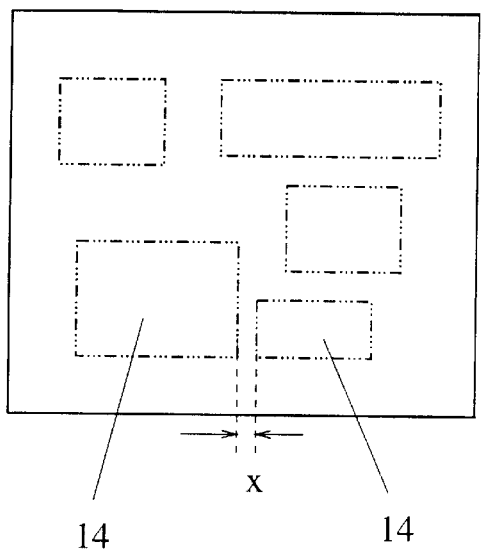

Instead of wet anisotropic etching, dry back side etching may be used. Dry back side etching has the advantage that the side walls 17 of the substrate 13 are vertical, as shown by way of example in FIG. 5a. This means that the volume occupied by the gap in the substrate 13 below the membrane 14 is no longer dependent on the thickness of the substrate 13 and thus a plurality of membranes 14 with reduced lateral spacing x between them can be achieved more easily as shown schematically in FIG. 5b.

The preferred embodiments of the present invention help to dramatically reduce self-heating of a semiconductor device including particularly an integrated circuit. The preferred embodiments of the present invention help to reduce parasitic conduction in the region of the membrane or membranes 14 and allow for more effective electrical isolation between devices, blocks of devices and/or circuits within the same integrated circuit. High frequency operation with low parasitic conduction can be achieved because the capacitances and resistances associated with the semiconductor substrate 13 are practically eliminated and latch-up or cross-talk via the substrate 13 is suppressed in the region of the membrane or membranes 14. This means that the entire chip can have an overall better electrical and/or thermal performance and higher speed. This makes the present invention particularly advantageous when applied to microprocessors and RF circuits.

Although the above refers primarily to silicon, the devices of the present invention can be built as already mentioned on other semiconductors such as silicon carbide (SiC), diamond, GaAs, GaN or other III-V materials.

In any of the examples, the membrane may have a thickness in the approximate range 0.1 $\mu$m to 10 $\mu$m or 20 $\mu$m.

Embodiments of the present invention have been described with particular reference to the examples illustrated. However, it will be appreciated that variations and modifications may be made to the examples described within the scope of the present invention.

What is claimed is:

1. A method of forming a semiconductor device having an active region, the method comprising:

forming, in a layer provided on a semiconductor substrate, a semiconductor device having an active region;

removing at least a portion of the semiconductor substrate below at least a portion of the active region such that said at least a portion of the active region is provided in a membrane defined by that portion of the layer below which the semiconductor substrate has been removed; and, applying a heat conducting and electrically insulating layer to the bottom surface of the membrane, the heat conducting and electrically insulating layer having a thermal conductivity that is higher than the thermal conductivity of the membrane so that the heat conducting and electrically insulating layer allows heat to pass from the active region into the heat conducting and electrically insulating layer during normal operation of the device.

2. A method according to claim 1, wherein said at least portion of the semiconductor substrate is removed by wet etching.

3. A method according to claim 1, wherein said at least a portion of the semiconductor substrate is removed by dry etching.

4. A method according to claim 1, wherein the heat conducting and electrically insulating layer comprises at least one of diamond, boron nitride, aluminium oxide, and aluminium nitride.

5. A method according to claim 1, wherein the heat conducting and electrically insulating layer is applied by blanket deposition.

6. A method according to claim 1, wherein the semiconductor device is provided on an electrically insulating layer, the electrically insulating layer being provided on the substrate, and wherein the removing at least a portion of the semiconductor substrate below at least a portion of the active region comprises removing said at least a portion of the semiconductor substrate up to the electrically insulating layer.

7. A method according to claim 1, comprising removing plural discrete portions of the semiconductor substrate to provide plural membranes, each membrane having provided therein a respective active region of one or more semiconductor devices; and wherein a heat conducting and electrically insulating layer is applied to the bottom surface of each membrane.

8. A device according to claim 1, wherein the heat conducting and electrically insulating layer is deposited at a lower temperature than the temperatures used in processing the active structure of the device.

9. A method according to claim 1, wherein the semiconductor device is an integrated circuit.

10. A semiconductor device manufactured in accordance with the method of claim 1.

* * * * *